United States Patent [19]

Imanishi et al.

[11] Patent Number: 4,538,198
[45] Date of Patent: Aug. 27, 1985

[54] PROTECTION CIRCUIT FOR AN OUTPUT TRANSISTOR

[75] Inventors: Kazuo Imanishi; Masaru Hashimoto; Makoto Mori, all of Yokohama, Japan

[73] Assignee: Tokyo Shibaura Denki Kabushiki Kaisha, Kawasaki, Japan

[21] Appl. No.: 515,680

[22] Filed: Jul. 21, 1984

Related U.S. Application Data

[63] Continuation-in-part of Ser. No. 343,260, Jan. 27, 1982, abandoned.

[30] Foreign Application Priority Data

Jan. 27, 1981 [JP] Japan .................................. 56-10569

[51] Int. Cl.[3] .............................................. H02H 3/26
[52] U.S. Cl. ........................................ 361/86; 361/87; 361/98
[58] Field of Search ...................... 361/86, 87, 93, 98

[56] References Cited

U.S. PATENT DOCUMENTS 4,355,341 10/1982 Kaplan ............................... 361/79

OTHER PUBLICATIONS

IEEE Transactions on Consumer Electronics, A New Chip and a New Package for Higher Power, vol. CE-26, Feb. 1980.

Primary Examiner—Harry E. Moose, Jr.
Attorney, Agent, or Firm—Oblon, Fisher, Spivak, McClelland & Maier

[57] ABSTRACT

A protection circuit for an output transistor which produces a protecting signal representing the power consumption of the output transistor, namely the product of collector current and collector to emitter voltage of the output transistor, thereby protecting the output transistor over a broad operating range.

4 Claims, 4 Drawing Figures

PROTECTION CIRCUIT FOR AN OUTPUT TRANSISTOR

This application is a continuation-in-part of application Ser. No. 343,260, filed Jan. 27, 1982, now abandoned.

BACKGROUND OF THE INVENTION

1. Field of the Invention

This invention relates to a protection circuit for an output transistor for example in an audio power circuit.

2. Description of the Prior Art

Usually, the output transistors providing the output signals in electric circuits or devices are susceptible to problems caused by the noise of external circuits or power supplies, and short circuiting problems.

Therefore, up to now, many kinds of protection circuits for the output transistors are used.

But the conventional protection circuits are operable by detecting the collector current or collector to emitter voltage of the output transistors. When the detected current or voltage exceeds the rated current or voltage of the output transistor, the power supply for the output transistor is cut by the operation of the protection circuit, for instance.

As described above, in the conventional protection circuits, only one of current or voltage of the output transistor is detected, such that it is impossible to protect the output transistors widely over the A.S.O. (Area of Safe Operation) of the output transistor.

SUMMARY OF THE INVENTION

Accordingly, one object of this invention is to provide a novel protection circuit for an output transistor by which it is possible to widen the protection area of the protection circuit over the entire A.S.O. (Area of Safety Operation) of the output transistors.

A further object of this invention is to provide an improved protection circuit capable of protecting the output transistor from both over current and over voltage by detecting the power consumption of the output transistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
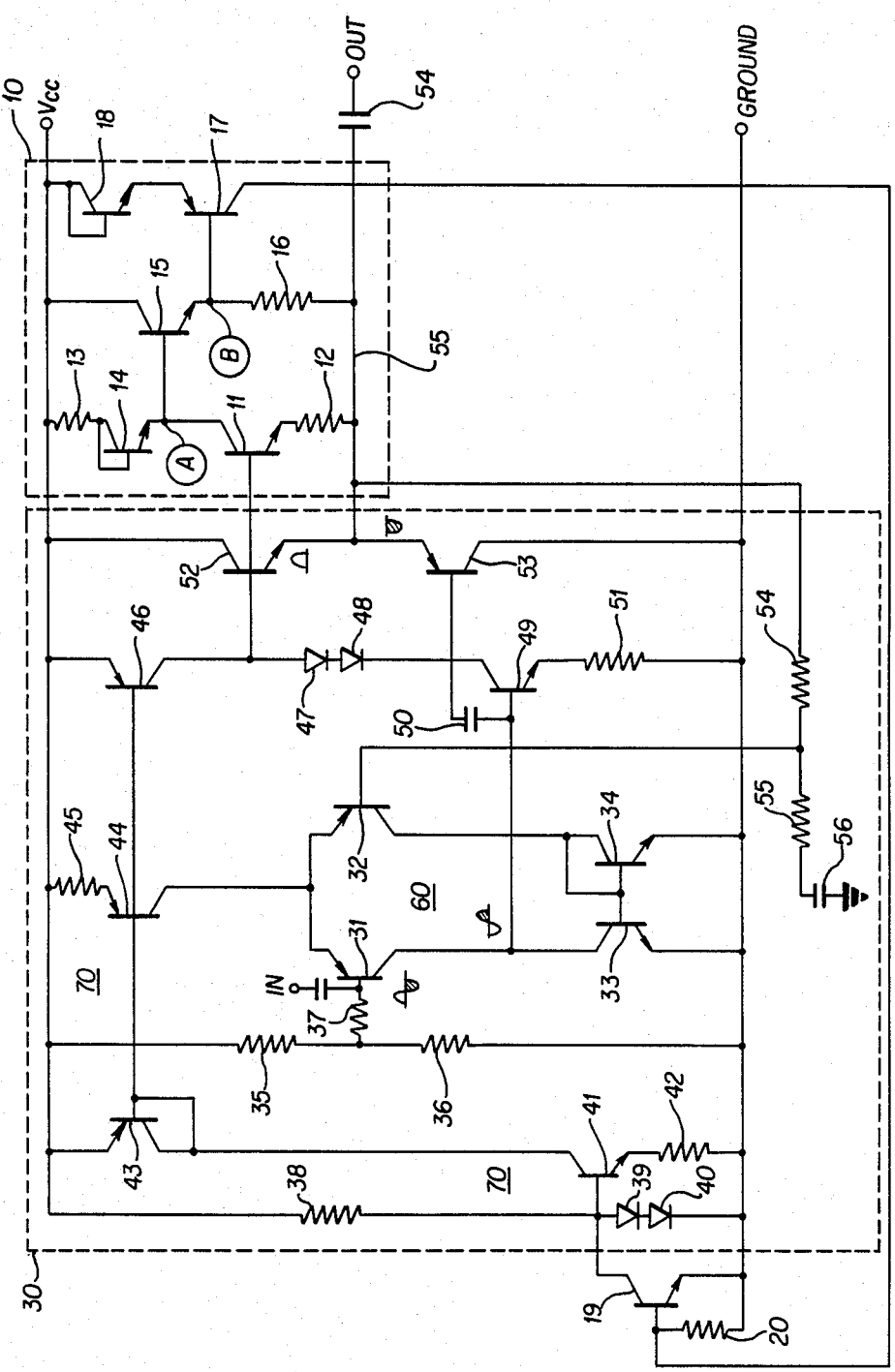
FIG. 1 is a circuit diagram showing a preferred embodiment of a protection circuit according to this invention.

Referring now to the drawings, wherein like reference numerals designate identical or corresponding parts throughout the several views, and more particularly to FIG. 1 thereof, in this embodiment, transistors (52) and (53) are output transistors being protected by a protection circuit (10) according to this invention.

In this configuration, the output transistors (52) and (53) are arranged and operated as a complementary class B push-pull amplifier (30). It is known that in the class B push-pull amplifier, one of the output transistors is operative only for positive going portions of output signal and the other is operative only for negative going portions of the output signal, and the overall operation is quasilinear.

In this configuration, a protection circuit (10) according to this invention protects the output transistor (52).

In this configuration, the amplifier (30) includes a differential amplifier (60). The input signal thereto is supplied to the base electrode of the transistor (31), namely input terminal (IN). The output signal of this amplifier (60) is supplied to the base electrode of the transistor (49). The collector electrode of transistor (49) is connected to the base electrode of output transistor (52) through diodes (47), (48), and directly to the base electrode of transistor (53). These diodes (47) and (48) provide a potential offset between base electrodes of transistors (52) and (53), which offset potential minimizes cross-over distortion of the amplifier.

Output transistors (52) and (53) are respectively operative only for positive going portions or negative going portions of the output signal of transistor (49). Output signals from the emitter electrodes of transistors (52) and (53) are combined at the output line (55), and delivered from output terminal (Out) through the coupling capacitor (54).

A constant current source (70) for this amplifier is constructed by resistor (38), diodes (39) (40), transistor (41) and resistor (42). A constant current from the current source (70) is supplied to the differential amplifier (60) and output transistors (52) and (53) by current mirror configuration (80) comprising transistors (43) (44) and (46).

Additionally, the amplifier (30) includes a negative feedback circuit including resistors (54), (55) and capacitor (56). The one end of the resistor (54) is connected to the output line (55) and the other end is connected to the base electrode of transistor (32).

The protection circuit (10) according to this invention includes a transistor (11) having a base electrode connected to the base electrode of transistor (52), an emitter electrode connected to the output line (55) through the resistor (12), and a collector electrode connected to terminal A and to the power supply terminal ($V_{cc}$) through the diode configuration transistor (14) and the resistor (13).

The resistor (12), in conjunction with resistor (13), is used to reduce the collector current of the transistor (11) for reducing the power consumption at the protection circuit (10).

And further reducing the power consumption at the protection circuit (10), the emitter area of the transistor (11) is formed smaller than that of the output transistor (52) (for example 1/300 compared with that of the output transistor(52)).

In such an arrangement, an unmatching of the operation condition between the transistor (52) and (11) occurs.

Namely, at the large collector current condition, because of the $I_c$ vs $V_{BE}$ characteristic of transistors, the base to emitter voltage $V_{BE}$ of a transistor tends to become larger compared with the relationship between the collector current $I_c$ and the base to emitter voltage $V_{BE}$ at the smaller collector current condition.

So, the base to emitter voltage $V_{BE}$ of the output transistor (52) tends to become large compared with that of the transistor (11).

Therefore, the resistor (12) compensates the unmatching of the operation between the transistors (52) and (11) as caused by the differences in emitter areas thereof.

The protection circuit (10) further includes a transistor (15) having a base electrode connected to the terminal (A), a collector electrode connected to the power supply terminal ($V_{cc}$), and an emitter electrode connected to the output line (55) through a resistor(16). Further included is a transistor (17) having a base electrode connected to the emitter electrode of the transistor (15), and an emitter electrode connected to the power supply terminal ($V_{cc}$) through a diode configuration transistor (18), and a collector electrode connected to the base electrode of transistor (19), and this collector electrode supplies the protecting signal.

Now the operation and the principle of the protection circuit (10) will be explained.

The base to emitter voltage $V_{BE52}$ of the transistor (52) can be expressed as $$V_{BE52} = \frac{kT}{q} \ln \frac{I_{C52}}{I_{S52} \cdot A_{e52}} \tag{1}$$

wherein
  q: charge on an electron
  k: Boltzman's constant
  T: Operating temperature in degrees in Kelvin
  $I_{C52}$: Collector current of transistor (52)
  $I_{S52}$: Saturation current of transistor (52)
  $A_{e52}$: Emitter area of transistor (52)

$V_{BE52}$ is equal to the sum of the base to emitter voltage $V_{BE11}$ of the transistor (11) and the voltage drop $V_{R12}$ of the resistor (14).

So, $$V_{BE52} = V_{BE11} + V_{R14} \tag{2}$$

$$= \frac{kT}{q} \ln \frac{I_{C11}}{I_{S11} \cdot A_{e11}} + I_{C11} \cdot R_{12}$$

Assuming the values of the resistors (12) and (13) are equal, the voltage $V_{BE52}$ is also equal to the voltage between the power supply terminal ($V_{cc}$) and terminal (A).

So the equation (2) can be expressed as $$V_{BE52} = \frac{kT}{q} \ln \frac{I_{C14}}{I_{S14} \cdot A_{e14}} + I_{C14} \cdot R_{13} \tag{3}$$

Moreover, the base to emitter voltage $V_{BE15}$ of transistor (15) is $$V_{BE15} = \frac{kT}{q} \ln \frac{I_{C15}}{I_{S15} \cdot A_{e15}} \tag{4}$$

and also $$V_{BE15} = \frac{kT}{q} \ln \frac{V_{CE52} - 2V_F}{R_{16} \cdot I_{S15} \cdot A_{e15}} \tag{5}$$

wherein $V_{CE52}$: collector to emitter voltage of transistor (52)

$V_F$: base to emitter voltage of transistors (17) and (18)
$R_{16}$: resistance value of resistor (16)

The voltage $V_B$ between the power supply terminal ($V_{cc}$) and the terminal (B) is the sum of the voltage $V_A$ between the power supply terminal ($V_{cc}$) and the terminal (A) and the base to emitter voltage $V_{BE15}$ of transistor (15), and the voltage $V_A$ is equal to the $V_{BE52}$, so $$V_B = \frac{kT}{q} \ln \frac{I_{C52}}{I_{S52} \cdot A_{e52}} + \frac{kT}{q} \ln \frac{V_{CE52} - 2V_F}{I_{S15} \cdot A_{e15} \cdot R_{16}} \tag{6}$$

and can be rewritten as $$V_B = \frac{kT}{q} \ln \frac{I_{C52} \cdot (V_{CE52} - 2V_F)}{I_{S52} \cdot I_{S15} \cdot A_{e52} \cdot A_{e15} \cdot R_{16}} \tag{7}$$

On the other hand, $V_B$ is the sum of the base to emitter voltage $V_{BE17}$ of the transistors (17) and (18). Namely, $$V_B = \frac{kT}{q} \ln \frac{I_{C17}}{I_{S17} \cdot A_{e17}} + \frac{kT}{q} \ln \frac{I_{C18}}{I_{S18} \cdot A_{e18}} \tag{8}$$

Assuming the collector currents $I_{C17}$ and $I_{C18}$ are equal, the equation (8) can be rewritten as $$V_B = \frac{kT}{q} \ln \frac{(I_{C17})^2}{I_{S17} \cdot I_{S18} \cdot A_{e17} \cdot A_{e18}} \tag{9}$$

Therefore, from the equations (7) and (9), $$(I_{C17})^2 = \frac{I_{S17} \cdot I_{S18} \cdot A_{e17} \cdot A_{e18}}{I_{S52} \cdot I_{S15} \cdot A_{e52} \cdot A_{e15} \cdot R_{16}} \cdot I_{C52}(V_{CE52} - 2V_F) \tag{10}$$

and in the equation (10), $$\frac{I_{S17} \cdot I_{S18} \cdot A_{e17} \cdot A_{e18}}{I_{S52} \cdot I_{S15} \cdot A_{e52} \cdot A_{e15} \cdot R_{16}}$$

is constant, so equation (10) can be rewritten as $$(I_{C17})^2 = K \cdot I_{C52} \cdot (V_{CE52} - 2V_F) \tag{11}$$

wherein $$K = \frac{I_{S17} \cdot I_{S18} \cdot A_{e17} \cdot A_{e18}}{I_{S52} \cdot I_{S15} \cdot A_{e52} \cdot A_{e15} \cdot R_{16}}$$

It is apparent from equation (11), the collector current $I_{C17}$ of transistor (17) is responsive to the product of the collector current $I_{C52}$ and the collector to emitter voltage $V_{CE52}$, namely the power consumption of output transistor (52).

So protecting the output transistor (52) based on the level of the collector current I of transistor (17) effectively means to protect the output transistor (52) based on its consumption power.

The collector electrode of transistor (17) is connected to the base electrode of transistor (19). The emitter electrode of transistor (19) is grounded, and collector electrode is connected to the base electrode of transistor (41). A resistor (20) is connected between the base electrode of transistor (19) and ground terminal (Gnd).

In this configuration, the protecting operation starts when transistor (19) becomes conductive.

Namely, the conductivity of the transistor (19) attempts to turn the transistor (41) non-conductive.

When the transistor (41) is turned off, the constant current supply to differential amplifier (60) and output transistors (52) and (53) is cut off.

In this way, the protecting operation is performed.

To vary the protection operation start level, the resistance value of resistors (12), (13), (16) and (20), and the emitter areas of the transistors forming the protection circuit (10) may be varied.

This means, for example, it is not necessary to match the voltages $V_{BE52}$ and $V_A$. The important thing is to develop the voltage dependent upon the collector current of output transistor (52) between the terminal (A) and power supply terminal ($V_{cc}$).

Figure 2:
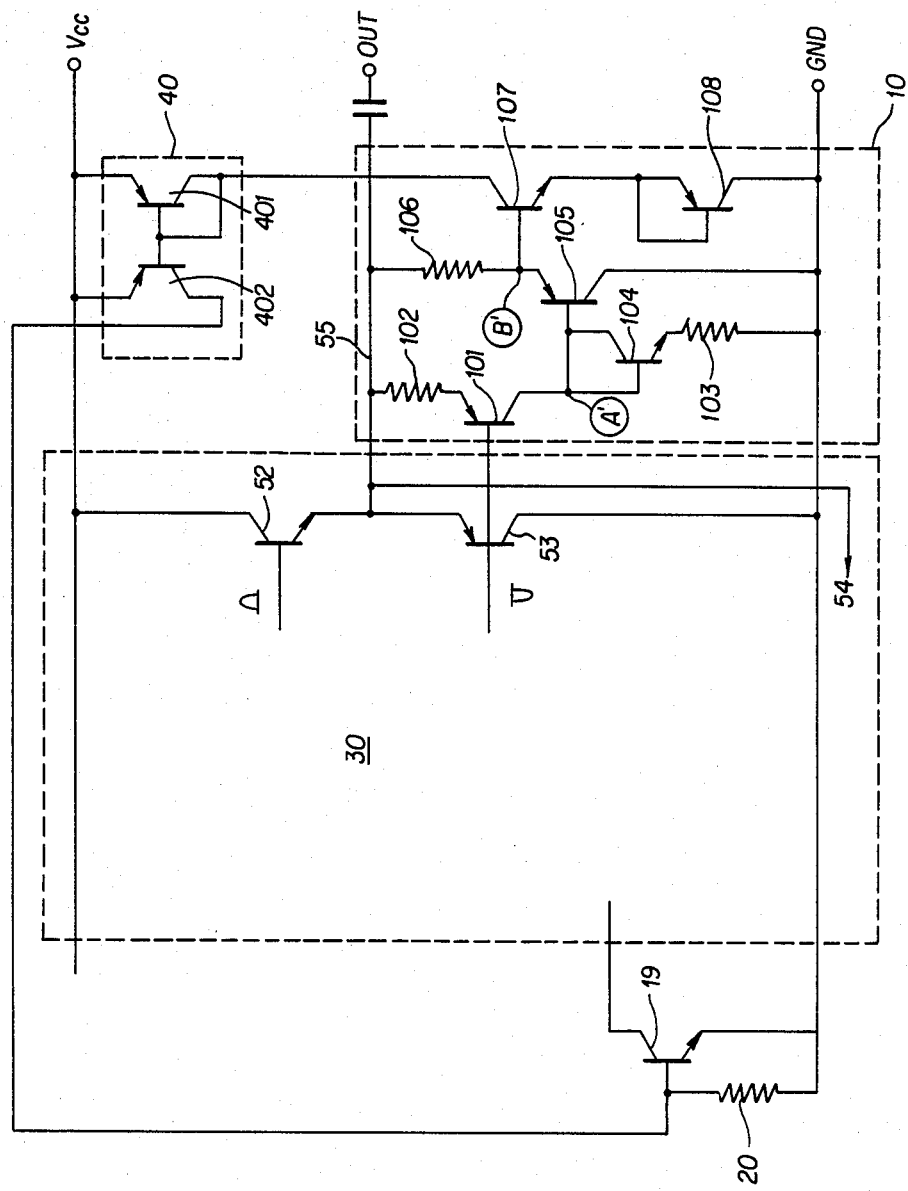
FIG. 2 is a circuit diagram of another preferred embodiment according to this invention.

FIG. 2 shows another preferred embodiment according to this invention.

In this configuration, the protection circuit (10) according to this invention is adapted to protect the output transistor (53). So in this configuration the protection operation is performed at the negative going portions of the input signal.

The detecting signal, namely the collector current $I_{C17}$ of transistor (107) is expressed as $$(I_{107})^2 = K \cdot I_{C53} \cdot (V_{CE53} - 2V_F) \tag{12}$$

in correspondance to equation (11), wherein $$K = \frac{I_{S107} \cdot I_{S108} \cdot A_{e107} \cdot A_{e108}}{I_{S53} \cdot I_{S105} \cdot A_{e53} \cdot A_{e105} \cdot R_{106}}$$

$V_F$: base to emitter voltage of transistors (107) and (108).

The collector current (107) may be supplied to the same terminal, namely to base electrode of the transistor (19) being inverted using current mirror circuit (40).

Figure 3:
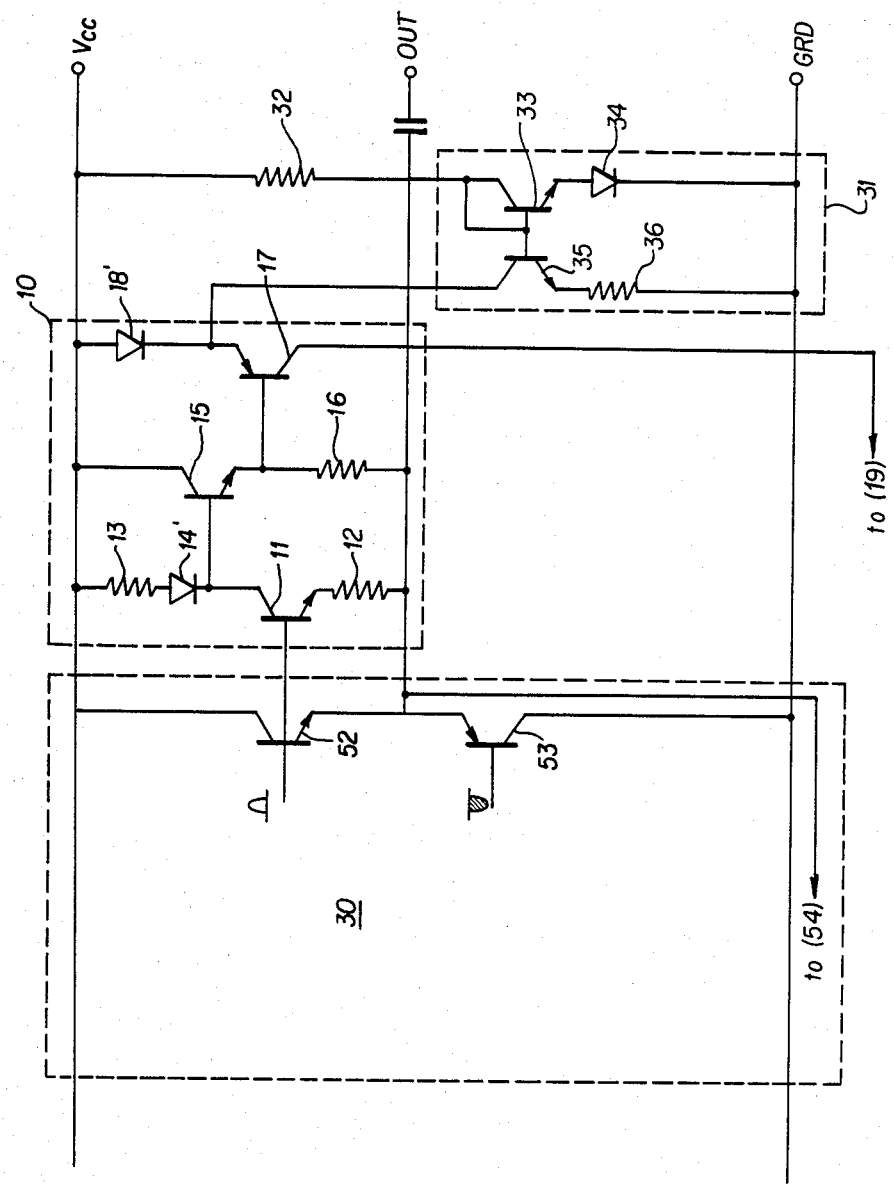
FIGS. 3 and 4 are circuit diagrams of further preferred embodiments according to this invention.

FIG. 3 shows another preferred embodiment according to this invention.

In this configuration, diode (14') and (18') are shown instead of the diode configuration transistors (14) and (18) in FIG. 1. Also constant current source (31) is further added. Namely, the constant current source (31) includes transistors (33), (35), diode (34) and resistor (36). The collector electrode of transistor (35) is connected to the emitter electrode of transistor (17). This constant current source (31) serves to vary the protecting level for the protection operation.

Figure 4:
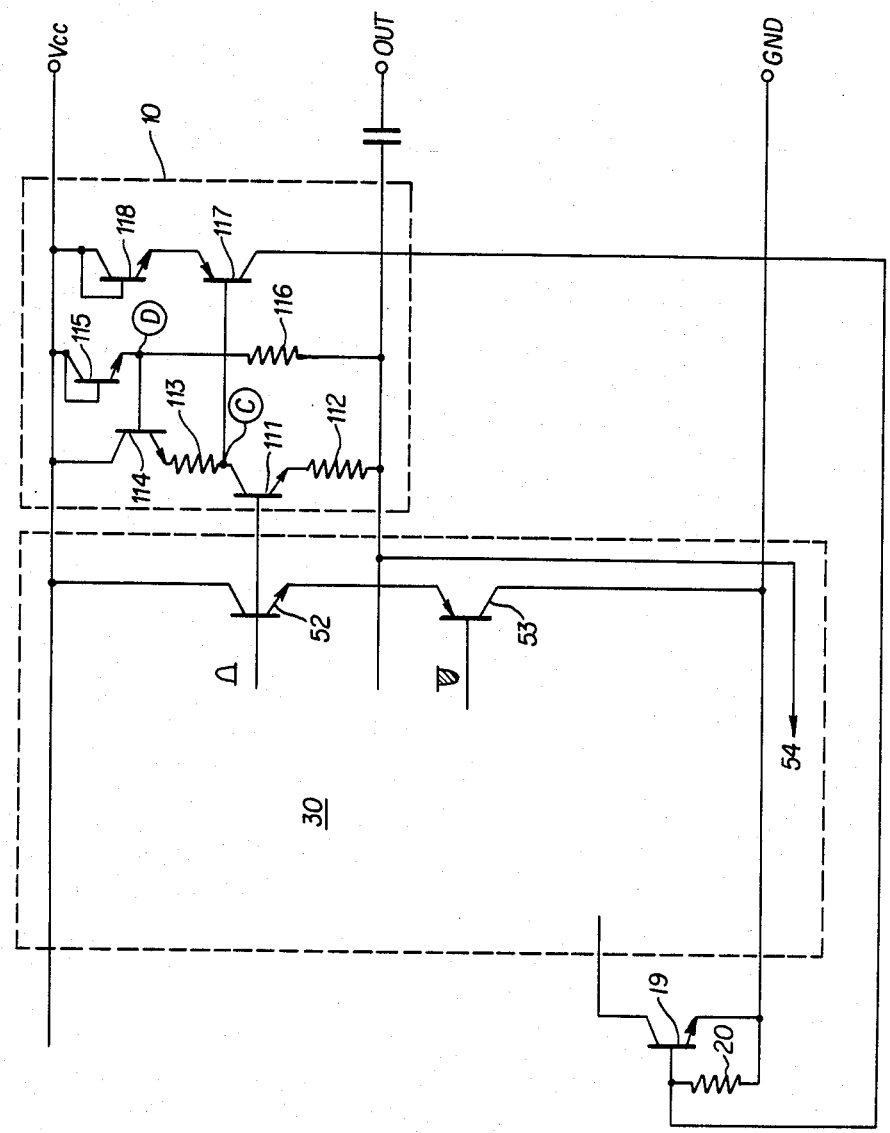

FIG. 4 shows another preferred embodiment according to this invention. In this configuration, the protection circuit (10) includes transistors (111), (114), (117), diodes (115), (118) and resistors (112), (113), (116). Of course, instead of diodes (115), (117), diode configuration transistors may be used.

In this configuration, base to emitter voltage $V_{BE52}$ is equal to the sum of the base to emitter voltage $V_{BE111}$ of transistor (111) and the voltage drop $V_{R112}$ of resistor (112).

So, $$V_{BE52} = \frac{kT}{q} \ln \frac{I_{C52}}{I_{S52} \cdot A_{e52}} \tag{13}$$

$$= \frac{kT}{q} \ln \frac{I_{C111}}{I_{S111} \cdot A_{e111}} + I_{C111} \cdot R_{112}$$

Assuming that the collector currents $I_{C111}$ and $I_{C114}$ of transistors (111) and (114) are equal, and resistance value $R_{112}$, $R_{113}$ of resistors (112), (113) are equal, the voltage between the terminals C and D is also equal to $V_{BE52}$.

$$V_{BE52} = \frac{kT}{q} \ln \frac{I_{C114}}{I_{S114} \cdot A_{e114}} + R_{113} \cdot I_{C114} \tag{14}$$

The current flowing in resistor (116) can be expressed as $$I_{116} = \frac{V_{CE52} - V_F}{R_{116}} \tag{15}$$

wherein $V_F$: base to emitter voltage of transistor (115).

Assuming this $I_{116}$ is equal to the collector current of transistor (115), the base to emitter voltage $V_{BE115}$ of transistor (115) can be expressed as $$V_{BE52} = \frac{kT}{q} \ln \frac{V_{CE52} - V_F}{I_{S115} \cdot A_{e115} \cdot R_{116}} \tag{16}$$

So the voltage $V_c$ between the ($V_{cc}$) terminal and terminal (C) can be expressed as the sum of the base to emitter voltage $V_{BE52}$ of transistor (52) and $V_{BE115}$ of transistor (115) expressed by equations (1) and (16) respectively.

So $$V_C = \frac{kT}{q} \ln \frac{I_{C52}}{I_{S52} \cdot A_{e52}} + \frac{kT}{q} \ln \frac{V_{CE52} - V_F}{I_{S115} \cdot A_{e115} \cdot R_{116}} \tag{17}$$

$$= \frac{kT}{q} \ln \frac{I_{C52} \cdot (V_{CE52} - V_F)}{I_{s52} \cdot I_{s115} \cdot A_{e52} \cdot A_{115} \cdot R_{116}}$$

This voltage $V_C$ is equal to the sum voltage of $V_{BE117}$ and $V_{BE118}$ of transistors (117) and (118). So $$V_C = \frac{kT}{q} \ln \frac{I_{C117}}{I_{S117} \cdot A_{e117}} + \frac{kT}{q} \ln \frac{I_{C118}}{I_{S118} \cdot A_{e118}} \tag{18}$$

$$= \frac{kT}{q} \ln \frac{I_{C117} \cdot I_{C118}}{I_{s117} \cdot I_{s118} \cdot A_{e117} \cdot A_{e118}}$$

Assuming collector currents $I_{C117}$ and $I_{C118}$ of transistors (117) and (118) are equal, the following equation is obtained by combining equations (17) and (18):

$$(I_{C117})^2 = K \cdot (V_{CE52} - V_F)I_{C52} \tag{19}$$

wherein K:

$$\frac{I_{S117} \cdot I_{S118} \cdot A_{e117} \cdot A_{e118}}{I_{S52} \cdot I_{S115} \cdot A_{e52} \cdot A_{e115} \cdot R_{116}}$$

It is apparent from equation (19), the collector current $I_{C117}$ of transistor (117) is also a function of the product of the collector current $I_{C52}$ and the collector to emitter voltage $V_{CE52}$ of transistor (52), so it is possible to detect the power consumption of transistor (52) by detecting the collector current $I_{C117}$ of transistor (117). This collector current $I_{C117}$ is supplied to the base electrode of the transistor (19). The protection operation is the same, as previously explained in the embodiment shown in FIG. 1 to FIG. 3.

As previously explained, in this invention, the protection operation is performed based on the power consumption of the output transistor. So the protection is performed according to the collector current and collector to emitter voltage of the output transistor, at the same time. Therefore, the flexibility of the operation is very large, and can be performed over the entire A.S.O. (Area of Safety Operation) of the output transistor.

The protection circuit according to this invention may be adapted to protect many other output transistors, and the protecting signal from the protection circuit may be used for indicating the excess power consumption of the output transistors.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A protection circuit for an output transistor having a base electrode, an emitter electrode, and a collector electrode, comprising:
    a first terminal coupled to the collector electrode of said output transistor;
    a second terminal coupled to the emitter electrode of said output terminal;
    a first transistor having a base electrode, an emitter electrode and a collector electrode;
    first means for connecting the base electrode of said first transistor to the base electrode of said output transistor;
    first resistor means coupled between said emitter electrode and said second terminal for reducing a collector current of said first transistor;
    second means comprising first diode means and second resistor means for connecting said collector electrode of said first transistor to said first terminal for producing a voltage being equal to the base to emitter voltage of said output transistor;
    a second transistor having a base electrode, an emitter electrode and a collector electrode;
    third means for connecting the base electrode of said second transistor to the collector electrode of said first transistor;
    fourth means for connecting the collector electrode of said second transistor to said first terminal;
    third resistor means coupled between said emitter electrode of said second transistor and said second terminal;
    a fourth transistor having a base electrode, an emitter electrode and a collector electrode;
    fifth means for connecting the base electrode of said fourth transistor to the emitter electrode of said third transistor; and
    second diode means coupled between said emitter electrode of said third transistor and said first terminal, thereby producing a protecting signal from the collector electrode of said third transistor.

2. A protection circuit for an output transistor according to claim 1, wherein the emitter area of said first transistor is formed smaller than that of said output transistor.

3. A protection circuit for an output transistor having a base electrode, an emitter electrode and a collector electrode, comprising:
    a first terminal coupled to the collector electrode of said output transistor;
    a second terminal coupled to the emitter electrode of said output transistor;
    a first transistor having a base electrode, an emitter electrode and a collector electrode;
    first means for connecting the base electrode of said first transistor to the base electrode of said output transistor;
    first resistor means coupled between said emitter electrode of said first transistor and said second terminal for reducing a collector current of said first transistor;
    a second transistor having a base electrode, an emitter electrode and a collector electrode;
    second resistor means coupled between said collector electrodes of said first transistor and the emitter electrode of said second transistor;
    second means for connecting the collector electrode of said second transistor to said first terminal;
    first diode means coupled between said base electrode of said second transistor and said first terminal;
    third resistor means coupled between said first diode means and said second terminal;
    output signal producing means connected to the collector electrode of said first transistor.

4. A protection circuit for an output transistor according to claim 3, wherein the emitter area of said first transistor is formed smaller than that of said output transistor.

* * * * *